(12) United States Patent
Han et al.

(10) Patent No.: US 12,189,297 B2
(45) Date of Patent: *Jan. 7, 2025

(54) METHODS FOR EXTREME ULTRAVIOLET (EUV) RESIST PATTERNING DEVELOPMENT

(71) Applicants: Tokyo Electron Limited, Tokyo (JP); Tokyo Electron U.S. Holdings, Inc., Austin, TX (US)

(72) Inventors: Yun Han, Albany, NY (US); Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/910,587

(22) PCT Filed: Nov. 11, 2021

(86) PCT No.: PCT/US2021/058963
§ 371 (c)(1),
(2) Date: Sep. 9, 2022

(87) PCT Pub. No.: WO2022/103949
PCT Pub. Date: May 19, 2022

(65) Prior Publication Data
US 2023/0341781 A1    Oct. 26, 2023

Related U.S. Application Data

(63) Continuation of application No. 17/097,921, filed on Nov. 13, 2020, now Pat. No. 11,079,682.

(51) Int. Cl.
*G03F 7/00* (2006.01)
*H01L 21/027* (2006.01)
*H01L 21/311* (2006.01)

(52) U.S. Cl.
CPC ...... *G03F 7/70033* (2013.01); *H01L 21/0274* (2013.01); *H01L 21/31116* (2013.01)

(58) Field of Classification Search
None
See application file for complete search history.

(56) References Cited

U.S. PATENT DOCUMENTS 11,079,682 B1 * 8/2021 Han .................... G03F 7/36
2017/0146909 A1   5/2017 Smith et al.
(Continued)

FOREIGN PATENT DOCUMENTS

| WO | 2018004646 A1 | 1/2018 |
| WO | 2022/103764 A1 | 5/2022 |
| WO | 2022/125388 A1 | 6/2022 |

OTHER PUBLICATIONS

Korean Intellectual Property Office, The International Search Report and Written Opinion for International Application No. PCT/US2021/058963, mailed Mar. 8, 2022, 8 pages.

(Continued)

*Primary Examiner* — Roberts P Culbert

(57) ABSTRACT

Methods are provided herein for patterning extreme ultraviolet (EUV) (or lower wavelength) photoresists, such metal-oxide photoresists. A patterning layer comprising a metal-oxide photoresist is formed on one or more underlying layers provided on a substrate, and portions of the patterning layer not covered by a mask overlying the patterning layer are exposed to EUV or lower wavelengths light. A cyclic dry process is subsequently performed to remove portions of the patterning layer exposed to the EUV or lower wavelength light (i.e., the exposed portions) and develop the metal-oxide photoresist pattern. The cyclic dry process generally includes a plurality of deposition and etch steps, wherein the deposition step selectively deposits a protective layer onto unexposed portions of the patterning layer by exposing the (Continued)

substrate to a first plasma, and the etch step selectively etches the exposed portions of the patterning layer by exposing the substrate to a second plasma.

20 Claims, 5 Drawing Sheets

(56) References Cited

U.S. PATENT DOCUMENTS

| | | |
|---|---|---|
| 2018/0068852 A1 | 3/2018 | Cottle et al. |
| 2018/0239244 A1* | 8/2018 | Raley .................. H01L 21/0337 |
| 2019/0131130 A1 | 5/2019 | Smith et al. |
| 2020/0013620 A1 | 1/2020 | Fung et al. |
| 2022/0002882 A1 | 1/2022 | Kalutarage et al. |
| 2022/0004105 A1 | 1/2022 | Dai et al. |
| 2022/0020584 A1 | 1/2022 | Volosskiy et al. |
| 2022/0244645 A1 | 8/2022 | Tan et al. |

OTHER PUBLICATIONS

Grenville, Andrew, et al. "Integrated Fab Process for Metal Oxide EUV Photoresist." Advances in Patterning Materials and Processes XXXII, 2015, doi:10.1117/12.2086006.

Luo, Chaoyun, et al. "Review of Recent Advances in Inorganic Photoresists." Royal Society of Chemistry, No. 71, Feb. 28, 2020, doi:https://doi.org/10.1039/C9RA08977B.

Grenville, Andrew, et al. "SPIE Advanced Lithography 2015." Integrated Fab Process for Metal Oxide EUV Photoresist, vol. 9425.

\* cited by examiner

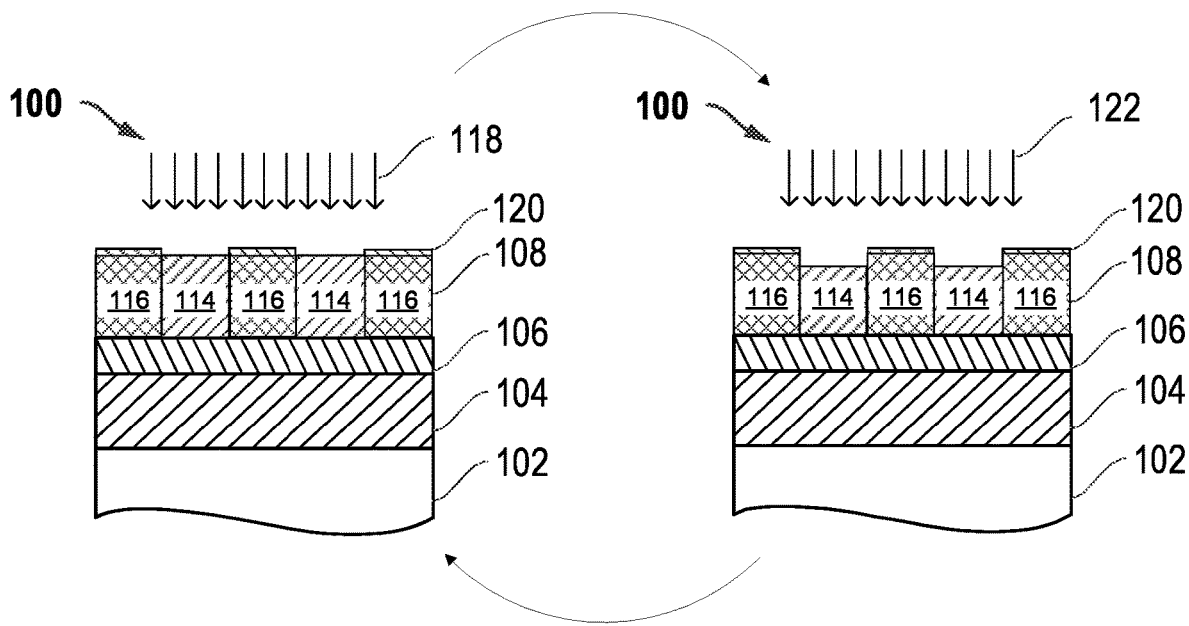
*FIG. 1D*  *FIG. 1E*
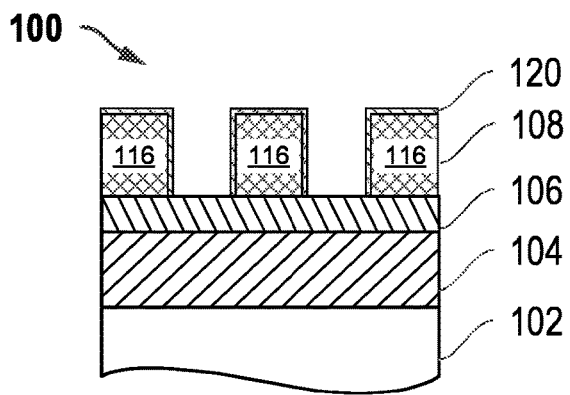
*FIG. 1F*

```
                                        ╱ 200

┌─────────────────────────────────────────────────┐
│ Forming a patterning layer and one or more underlying layers on │ ╱ 210
│ the substrate, wherein the patterning layer comprises a metal-oxide │
│                    photoresist                  │
└─────────────────────────────────────────────────┘
                          │
                          ▼
┌─────────────────────────────────────────────────┐
│ Performing an extreme ultraviolet (EUV) lithography step, in which │ ╱ 220
│ portions of the patterning layer not covered by an overlying mask │
│              are exposed to EUV light           │
└─────────────────────────────────────────────────┘
                          │
                          ▼
┌─────────────────────────────────────────────────┐
│ Performing a cyclic, dry process to remove the portions of the │ ╱ 230
│ patterning layer exposed to the EUV light and develop the metal- │
│              oxide photoresist pattern          │
└─────────────────────────────────────────────────┘
```

*FIG. 2*

METHODS FOR EXTREME ULTRAVIOLET (EUV) RESIST PATTERNING DEVELOPMENT

INCORPORATION BY REFERENCE

This application claims the benefit of priority to PCT international application no. PCT/US2021/058963 filed Nov. 11, 2021 and U.S. Nonprovisional application Ser. No. 17/097,921, filed on Nov. 13, 2020, the contents of which are incorporated herein by reference in their entirety.

BACKGROUND

The present disclosure relates to the processing of substrates. In particular, it provides a novel system and method for patterning EUV (or lower wavelength) photoresists.

To achieve reduced feature sizes, patterning using extreme ultraviolet (EUV) lithography has been introduced in processing systems. EUV lithography typically uses light having a wavelength from 6 to 16 nanometers (nm) or below. For example, EUV patterning techniques have been introduced into production at sub-7 nm node advanced semiconductor device manufacturing. Although reduced feature sizes are achieved, pattern performance problems have occurred in EUV patterning.

Chemically amplified resists (CARs) have been used in EUV lithography to transfer patterns onto one or more underlying layers formed on a substrate. Although such resists have good sensitivity, the resolution of CARs is strongly affected by pattern collapse, which is increasingly important as feature sizes approach the nanometer scale. In addition, it is challenging to reduce the aspect ratio (film thickness/critical dimension) of CARs because of their high susceptibility to the non-uniform distribution of components in the film. As a result, poor imaging performance tends to be obtained with CARs.

Metal-oxide photoresists have also been used in negative tone EUV lithography to transfer patterns onto one or more underlying layers formed on a substrate. Compared to CARs, metal-oxide photoresists offer the advantages of very thin film thicknesses and minimize the risk of pattern collapse. Although a promising replacement for CARs, conventional processes used to form metal-oxide photoresists utilize a wet process for pattern development. For example, metal-oxide photoresists may be developed using a wet organic developer in a negative tone photoresist process Though negative tone photoresists may be adequate for patterning line/space features and blocks, negative tone photoresists have not been satisfactory for patterning other features, such as holes or vias.

As such, a need exists for an improved process and method for patterning metal-oxide photoresists used in EUV (or lower wavelength) lithography.

SUMMARY

Improved process flows and methods are provided herein for patterning extreme ultraviolet (EUV) or lower wavelength photoresists. More specifically, improved process flows and methods are provided herein for patterning metal-oxide photoresists, which may be used in EUV (or lower wavelength) lithography to transfer patterns onto one or more underlying layers formed on a substrate. In the disclosed process flows and methods, a patterning layer comprising a metal-oxide photoresist is formed on one or more underlying layers provided on a substrate, and portions of the patterning layer not covered by a mask overlying the patterning layer are exposed to EUV or lower wavelength light. EUV or lower wavelength exposure separates organic ligands from metal-oxide structures (e.g., cages or chains) within the exposed portions of the metal-oxide photoresist, while leaving unexposed portions of the metal-oxide photoresist unchanged. After EUV or lower wavelength exposure, a bake process is performed to release the organic ligands freed from the exposed portions of the metal-oxide photoresist, and a plasma process is used to remove (e.g., etch) the exposed portions to develop the metal-oxide photoresist pattern.

The plasma process described herein may use a plurality of deposition and etch steps to develop the metal-oxide photoresist pattern. In some embodiments, a hydrocarbon or fluorocarbon based plasma may be used in the deposition step to selectively deposit a protective layer (or film) onto the unexposed portions of the metal-oxide photoresist. During the etch step, a hydrogen or halogen based plasma may be used to selectively convert a surface of the exposed portions of the metal-oxide photoresist into a volatile material (e.g., a metal hydride, halide or chloride), which can be removed for example via ion bombardment. The protective layer selectively deposited onto the unexposed portions of the metal-oxide photoresist protects the unexposed portions from erosion, while the exposed portions of the metal-oxide photoresist are selectively etched during the etch step. In some embodiments, the plasma development process described herein may continue in a cyclical manner, repeating the selective deposition and selective etch steps, until the exposed portions of the metal-oxide photoresist are completely removed.

According to one embodiment, a method is provided for patterning a substrate. In this embodiment, the method may include forming a patterning layer and one or more underlying layers on the substrate, wherein the patterning layer comprises a metal-oxide photoresist, and performing an extreme ultraviolet (EUV) or lower wavelength lithography step, in which portions of the patterning layer not covered by an overlying mask are exposed to EUV or lower wavelength light. In addition, the method may include performing a cyclic, dry process to remove the portions of the patterning layer exposed to the EUV or lower wavelength light and develop a metal-oxide photoresist pattern.

In some embodiments, the cyclic, dry process may include selectively depositing a protective layer onto unexposed portions of the patterning layer by exposing the substrate to a first plasma, selectively etching exposed portions of the patterning layer by exposing the substrate to a second plasma, and repeating the selectively depositing and the selectively etching until the exposed portions of the patterning layer are completely removed. The unexposed portions of the patterning layer are portions that are covered by the overlying mask and not exposed to the EUV or lower wavelength light. The exposed portions of the patterning layer, on the other hand, are not covered by the overlying mask and are exposed to the EUV or lower wavelength light.

The first plasma and the second plasma may utilize a wide variety of precursor gas(es). In some embodiments, the first plasma may comprise a hydrocarbon or fluorocarbon based precursor gas. In some embodiments, the second plasma may comprise a hydrogen or halogen containing precursor gas and an inert gas.

Each time the selectively etching step is performed, the hydrogen or halogen containing precursor gas converts a surface of the exposed portions of the patterning layer into a volatile material, and ions of the inert gas bombard a surface of the substrate to remove the volatile material from the exposed portions. Each time the selectively depositing step is performed, a new protective layer is deposited onto the unexposed portions of the patterning layer.

According to another embodiment, another method is provided for patterning a substrate. In this embodiment, the method may include forming a patterning layer and one or more underlying layers on the substrate, wherein the patterning layer comprises a metal-oxide photoresist, and exposing portions of the patterning layer, which are not covered by a mask overlying the patterning layer, to extreme ultraviolet (EUV) or lower wavelength light. In addition, the method may include selectively depositing a protective layer onto unexposed portions of the patterning layer by exposing the substrate to a first plasma, selectively etching the exposed portions of the patterning layer by exposing the substrate to a second plasma, and repeating the selectively depositing and the selectively etching steps until the exposed portions of the patterning layer are completely removed.

In some embodiments, the patterning layer may comprise a metal-oxide material, which includes clusters of metal-oxide structures having chemically bound organic ligands. In such embodiments, exposing the portions of the patterning layer not covered by the patterned mask layer to EUV or lower wavelength light separates the organic ligands from the metal-oxide structures, while leaving the unexposed portions of the patterning layer unchanged. After exposing the portions of the patterning layer not covered by the patterned mask layer to EUV or lower wavelength light and before selectively depositing the protective layer onto the unexposed portions of the patterning layer, the method may further include performing a bake process to release the organic ligands from the exposed portions of the patterning layer.

As noted above, the first plasma and the second plasma may utilize a wide variety of precursor gas(es). In some embodiments, the first plasma may comprise a hydrocarbon or fluorocarbon based precursor gas. For example, the first plasma may comprise $CH_4$, $C_4F_8$, $C_4F_6$ or $CH_3F$. In some embodiments, the second plasma may comprise a hydrogen or halogen containing precursor gas. For example, the second plasma may comprise $CH_4$, $CF_4$, $CHF_3$ or $BCl_3$. In some embodiments, the second plasma may further comprise an inert gas. For example, the second plasma may further comprise argon (Ar). When the second plasma contains a hydrogen or halogen containing precursor gas and an inert gas, the hydrogen or halogen containing precursor gas converts a surface of the exposed portions of the patterning layer into a volatile material, and the inert gas ions bombard the surface of the exposed portions to remove the volatile material.

In some embodiments, the steps of selectively depositing a protective layer onto unexposed portions of the patterning layer and selectively etching the exposed portions of the patterning layer are performed simultaneously within a plasma processing chamber using the same plasma precursor gases to generate the first plasma and the second plasma. In such embodiments, for example, the first plasma and the second plasma may each comprise a hydrocarbon precursor and an inert gas.

In other embodiments, the steps of selectively depositing a protective layer onto unexposed portions of the patterning layer and selectively etching the exposed portions of the patterning layer are segregated within a plasma processing chamber, so that different plasma precursor gases are used to generate the first plasma and the second plasma. In such embodiments, for example, the first plasma may comprise a hydrocarbon precursor, and the second plasma may comprise a halocarbon precursor and an inert gas.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 1A-1F illustrate an improved process flow for patterning a substrate, and more specifically, for patterning extreme ultraviolet (EUV) photoresists.

FIG. 2 is a flowchart diagram illustrating one embodiment of a method for patterning a substrate.

DETAILED DESCRIPTION

Figures 1A, 1B:
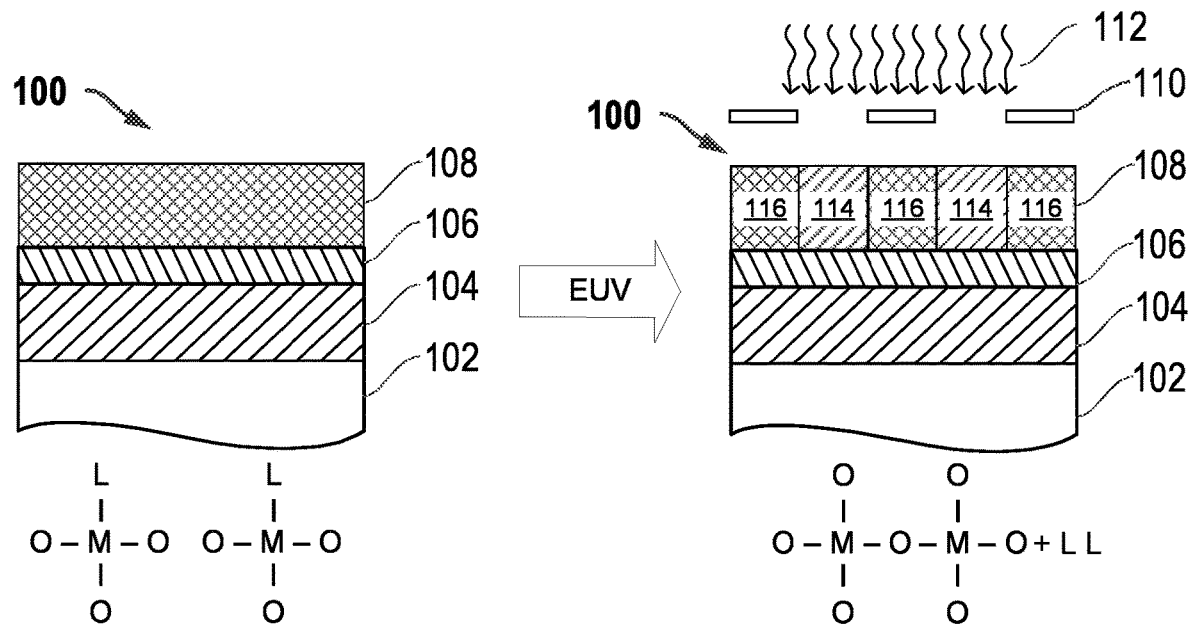

Improved process flows and methods are provided herein for patterning extreme ultraviolet (EUV) (or lower wavelength) photoresists. More specifically, improved process flows and methods are provided herein for patterning metal-oxide photoresists, which may be used in EUV or lower wavelength lithography to transfer patterns onto one or more underlying layers formed on a substrate. The process flows and methods disclosed herein may utilize a wide variety of metal-oxide materials including, but not limited to, metal-oxides comprising tin (Sn), hafnium (Hf) and zirconium (Zr). Although metal-oxide materials containing Sn, Hf or Zr are disclosed herein as examples, the process flows and methods disclosed herein are extendible to other metal-oxide materials and metal-containing photoresists. As described herein, an example embodiment utilizing EUV wavelength light is discussed. However, the techniques utilized herein are not limited to EUV wavelengths. Further, the techniques may be particularly advantageous for EUV or lower wavelengths of light. Thus, though described in some examples herein with regard to EUV wavelengths, the techniques provided may also be applicable to EUV or lower wavelengths of light.

In the disclosed process flows and methods, a patterning layer comprising a metal-oxide photoresist is formed on one or more underlying layers provided on a substrate, and portions of the patterning layer not protected by a mask between the light source and the patterning layer are exposed to EUV light. EUV exposure separates organic ligands from metal-oxide structures (e.g., cages or chains) within the exposed portions of the metal-oxide photoresist, while leaving unexposed portions of the metal-oxide photoresist unchanged. After EUV exposure, a bake process is performed to release the organic ligands freed from the exposed portions of the metal-oxide photoresist, and a plasma process is used to remove (e.g., etch) the exposed portions to develop the metal-oxide photoresist pattern. In this manner a dry plasma develop of a metal-oxide photoresist is provided.

The plasma process described herein may use a plurality of deposition and etch steps to develop the metal-oxide photoresist pattern. In some embodiments, a hydrocarbon or fluorocarbon based plasma may be used in the deposition step to selectively deposit a protective layer (or film) onto the unexposed portions of the metal-oxide photoresist. During the etch step, a hydrogen or halogen based plasma may be used to selectively convert a surface of the exposed portions of the metal-oxide photoresist into a volatile material (e.g., a metal hydride, halide or chloride), which can be removed for example via ion bombardment. The protective layer selectively deposited onto the unexposed portions of the metal-oxide photoresist protects the unexposed portions from erosion, while the exposed portions of the metal-oxide photoresist are selectively etched during the etch step. In some embodiments, the plasma development process described herein may continue in a cyclical manner, repeating the selective deposition and selective etch steps, until the exposed portions of the metal-oxide photoresist are completely removed.

Accordingly, a novel plasma development process for a metal-oxide photoresist is disclosed herein for advanced EUV patterning. The plasma development process allows selective deposition and selective etch at molecular/atomic level through precise plasma process control. In addition to other plasma process parameters, plasma precursors are chosen to selectively convert a surface of the EUV activated areas (i.e., the exposed portions of the metal-oxide photoresist) into a more volatile material (e.g., a metal hydride, halogen, or chloride) in the selective etch step, and to selectively deposit a protective layer on the un-activated areas (i.e., the unexposed portions of the metal-oxide photoresist) in the selective deposition step. In some embodiments, the plasma processing steps disclosed herein may be performed simultaneously within the plasma process chamber using the same plasma precursors for both deposition and etch steps. In other embodiments, the plasma processing steps may be segregated within the plasma process chamber, so that different plasma precursors can be used to perform the deposition and etch steps.

FIG. 1A-1F illustrate one embodiment of an improved process flow for patterning EUV metal-oxide photoresists according to the techniques disclosed herein. It will be recognized that the embodiment shown in FIGS. 1A-1F is merely exemplary and the techniques described herein may be applied to other process flows.

As shown in FIG. 1A, substrate 100 includes a patterning layer 108 formed over one or more underlying layers, such as for example, a hard mask layer 106, a sacrificial carbon layer 104 and a base substrate 102. Base substrate 102 may be any substrate for which the use of patterned features is desirable. For example, base substrate 102 may be a semiconductor substrate having one or more semiconductor processing layers formed thereon. In one embodiment, base substrate 102 may be a substrate that has been subject to multiple semiconductor processing steps which yield a wide variety of structures and layers, all of which are known in the substrate processing art.

Hard mask layer 106 and sacrificial carbon layer 104 may be formed from any of a wide variety of materials, as is known in the art. In one embodiment, the hard mask layer 106 may be a spin on glass (SOG) layer and the sacrificial carbon layer 104 may be a spin on carbon (SOC) layer. It is recognized, however, that the underlying layers described and shown in the figures are merely exemplary, and more, less or other underlying layers may be utilized.

The patterning layer 108 shown in FIG. 1A may be formed from any of a wide variety of materials commonly used in EUV lithography. For example, the patterning layer 108 may be a metal-oxide photoresist. In some embodiments, the patterning layer 108 may comprise a metal-oxide material containing tin (Sn), hafnium (Hf) or zirconium (Zr). Other metal-oxide materials may also be used to implement the patterning layer 108. In some embodiments, a metal-containing, non-oxide photoresist material may be used to implement the patterning layer 108. The patterning layer 108 may generally be formed using any of a wide variety of deposition processes. In some embodiments, for example, a spin coating process may be utilized to form the patterning layer 108. However, the techniques described herein are not limited to the method of forming the patterning layer 108.

In the example embodiment shown in FIG. 1A, the patterning layer 108 comprises a metal-oxide material, which includes clusters of metal-oxide structures (M-O) having chemically bound organic ligands (L). As described in more detail below, the process flow shown in FIGS. 1B-1C exposes portions of the patterning layer 108 to extreme ultraviolet (EUV) light to separate or free the organic ligands (L) from the metal-oxide structures (M-O), and performs a bake process to release the freed ligands from the EUV exposed portions of the patterning layer 108. Once the organic ligands are freed, a cyclical dry process is used to remove the EUV exposed portions of the patterning layer 108 and develop the metal-oxide photoresist pattern, as shown in FIGS. 1D-1F.

After patterning layer 108 is formed in FIG. 1A, a mask 110 is provided above the patterning layer 108 and an EUV lithography step is performed in FIG. 1B. During the EUV lithography step shown in FIG. 1B, the exposed portions 114 of the patterning layer 108 (i.e., the portions of the patterning layer 108 not protected by the mask 110) are exposed to EUV light 112. As shown in FIG. 1B, EUV exposure separates the organic ligands (L) from the metal-oxide structures (M-O) within only the exposed portions 114 of the patterning layer 108, while leaving the unexposed portions 116 of the patterning layer 108 unchanged.

Figure 1C:
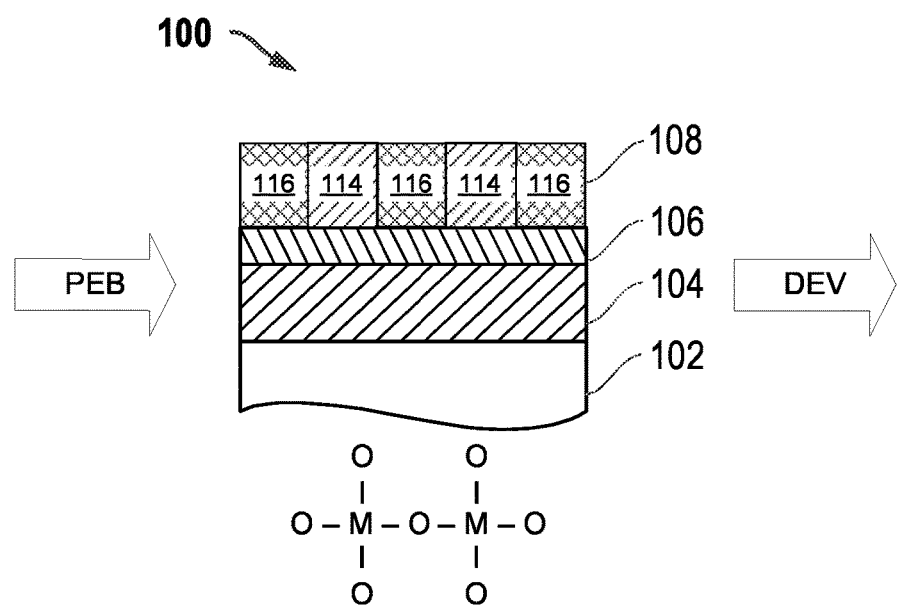

After the EUV lithography step is performed in FIG. 1B, a post exposure bake (PEB) process is performed to release the freed ligands from the exposed portions 114 of the patterning layer 108, leaving only dense metal-oxide structures (M-O) in the exposed portions 114, as shown in FIG. 1C. After the PEB process is performed, a dry process (e.g., a plasma development process) is used to remove the exposed portions 114 of the patterning layer 108 to develop the metal-oxide photoresist pattern.

FIGS. 1D-1F illustrate one embodiment of a plasma development process that may be used to develop a metal-oxide photoresist pattern in accordance with the techniques described herein. As described in more detail below, the disclosed plasma development process may generally include a plurality of deposition and etch steps. In some embodiments, the plasma development process may begin by exposing the substrate 100 to a first plasma 118 to selectively deposit a protective layer 120 onto the unexposed portions 116 of the patterning layer 108, as shown in FIG. 1D. After the protective layer 120 is formed on the unexposed portions 116, the substrate 100 is exposed to a second plasma 122 to selectively etch or remove the exposed portions 114 of the patterning layer 108, as shown in FIG. 1E. The protective layer 120 protects the unexposed portions 116 of the patterning layer 108 from erosion, while the exposed portions 114 of the patterning layer 108 are selectively etched or removed during the selective etch step. In some embodiments, the plasma development process shown in FIGS. 1D and 1E may continue in a cyclical manner, by repeating the selective deposition and selective etch steps a number of cycles and/or until the exposed portions 114 of the patterning layer 108 are completely removed, as shown in FIG. 1F.

Various plasma chemistries may be used in the selective deposition step shown in FIG. 1D. In some embodiments, the first plasma 118 may use a hydrocarbon or fluorocarbon based precursor gas chemistry to selectively deposit the protective layer 120 onto the unexposed portions 116 of the patterning layer 108. Examples of hydrocarbon and fluorocarbon based chemistries that may be used within the first plasma 118 include, but are not limited to, $CH_4$, $C_4F_8$, $C_4F_6$ or $CH_3F$. Other hydrocarbon or fluorocarbon based chemistries may also be used in the selective deposition step shown in FIG. 1D.

Various plasma chemistries may also be used in the selective etch step shown in FIG. 1E. In some embodiments, the second plasma 122 may use a hydrogen or halogen containing precursor gas chemistry to convert a surface of the exposed portions 114 into a volatile material (e.g., a metal hydride, halide or chloride), and may use an inert gas (such as, e.g., argon) to selectively etch or remove the volatized surface via ion bombardment. Examples of hydrogen or halogen containing precursor gas chemistries that may be used within the second plasma 122 include, but are not limited to, hydrocarbons (e.g., $CH_4$), halocarbons (e.g., $CF_4$, $CHF_3$) and other halogen based chemistries (e.g., $BCl_3$) commonly used in plasma etching. In some embodiments, a combination of a hydrocarbon precursor gas and an inert gas may be used to generate the second plasma 122. In other embodiments, the second plasma 122 may include a halocarbon, hydrogen and inert gas combination.

The hydrogen (or halogen) components included within the second plasma 122 facilitate etching by converting the surface of the metal oxide material within the exposed portions 114 into volatized metal hydrides, halides or chlorides, which are removed in one embodiment via ion bombardment. In some embodiments, the selective etch step shown in FIG. 1E may be performed as a single step by exposing the substrate 100 to a plasma containing a hydrogen (or halogen) containing precursor gas and an inert gas (such as argon). In other embodiments, the selective etch step may be a cyclic process that exposes the substrate 100 to a hydrogen (or halogen) based plasma before exposing the substrate 100 to an argon plasma.

Although one example embodiment is described herein with regard to argon (Ar), other inert gas ions may also be used to bombard the surface of the exposed portions 114 in the selective etch step shown in FIG. 1D. Exemplary inert gases include, but are not limited to He, Ne, Kr, and other noble gases. Further, other gases may be utilized in combination with the argon and/or noble gases. For example, other gases may be added to the plasma, as the plasma is not limited to only having argon or noble gases. For example, other inert gases or other gases that are not inert gases may be added to the process.

In some embodiments, the selective deposition and selective etch steps shown in FIGS. 1D and 1E may be performed simultaneously within the plasma processing chamber, or alternatively, may be segregated into two plasma processing steps and separated for example by one or more purge steps. In one embodiment, the selective deposition and etch steps may be performed simultaneously within the plasma process chamber using the same plasma precursors (e.g., $CH_4$) for both deposition and etch steps. In other embodiments, the selective deposition and etch steps may be segregated within the plasma process chamber, so that different plasma precursors can be used in the deposition and etch steps. For example, the selective deposition and etch steps may be segregated within the plasma process chamber, so that a hydrocarbon precursor (e.g., $CH_4$) can be used in the deposition step, while a hydrogen ($H_2$), halocarbon (e.g., $CF_4$ or $CHF_3$) and halogen based chemistry (e.g., $BCl_3$) is used in the etch step.

The selective deposition and etch steps shown in FIGS. 1D and 1E may be performed as a cyclic process, which is repeated a number of cycles until the exposed portions 114 of the patterning layer 108 are completely removed as shown in FIG. 1F. Each time an etch step is performed, some or all of the protective layer 120 formed on the unexposed portions 116 may be removed along with the volatized surface of the exposed portions 114. In one embodiment, a very thin protective layer may remain after each cycle. At each subsequent deposition step, a new protective layer 120 is formed on the top and sides of the unexposed portions 116 as shown in FIG. 1F. In order to avoid etching the hard mask layer 106 underlying the patterning layer 108, the plasma chemistries used in the selective deposition and etch steps described herein may generally be selective to the hard mask layer 106.

Compared to conventional pattern development processes, which use a wet process to develop negative tone, metal-oxide photoresists, the plasma development process shown in FIGS. 1D-1F uses a cyclic, dry process for pattern development of positive tone photoresists. Unlike negative tone photoresists, positive tone photoresists can be used for hole, block and line/space patterning in narrow geometry processes. By utilizing a cyclic, dry process for pattern development, the plasma development process described herein provides atomic layer control of surface reactions and improves line edge roughness (LER) and critical dimension (CD) control compared to conventional wet process pattern development. The plasma development process described herein is also cleaner and more cost effective than conventional wet process pattern development.

Figure 3:
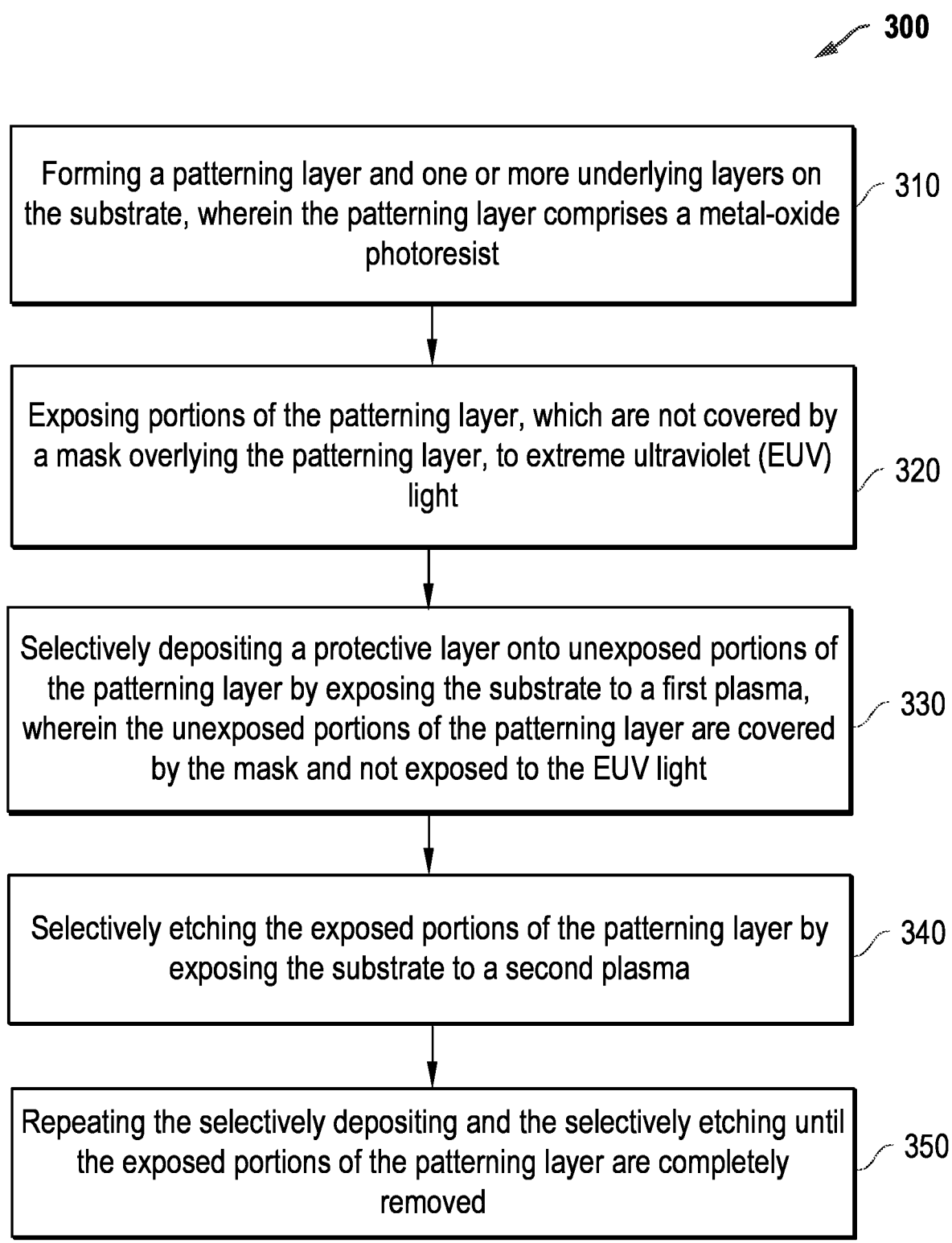
FIG. 3 is a flowchart diagram illustrating another embodiment of a method for patterning a substrate.

FIGS. 2-3 illustrate exemplary methods for patterning a substrate, which use the plasma development process described herein. It will be recognized that the embodiments of FIGS. 2-3 are merely exemplary and additional methods may utilize the techniques described herein. Further, additional processing steps may be added to the methods shown in the FIGS. 2-3 as the steps described are not intended to be exclusive. Moreover, the order of the steps is not limited to the order shown in the figures as different orders may occur and/or various steps may be performed in combination or at the same time. Further, though described with relation to EUV light, it will be recognized that the methods of FIGS. 2-3 may be advantageous for EUV or lower wavelengths of light.

FIG. 2 illustrates one embodiment of a method 200 that may be used to pattern a substrate using the techniques disclosed herein. In some embodiments, the method 200 may begin by forming a patterning layer and one or more underlying layers on the substrate, wherein the patterning layer comprises a metal-oxide photoresist (in step 210). After the patterning layer is formed, the method 200 performs an extreme ultraviolet (EUV) lithography step, in which portions of the patterning layer not covered by an overlying mask are exposed to EUV light (in step 220). In step 230, the method 200 performs a cyclic, dry process to remove the portions of the patterning layer exposed to the EUV light and develop the metal-oxide photoresist pattern.

FIG. 3 illustrates another embodiment of a method 300 that may be used to pattern a substrate using the techniques disclosed herein. In some embodiments, the method 300 may begin by forming a patterning layer and one or more underlying layers on the substrate, wherein the patterning layer comprises a metal-oxide photoresist (in step 310). After the patterning layer is formed, the method 300 exposes portions of the patterning layer, which are not covered by a mask overlying the patterning layer, to extreme ultraviolet (EUV) light (in step 320). In step 330, the method 300 selectively deposits a protective layer onto unexposed portions of the patterning layer by exposing the substrate to a first plasma. The unexposed portions of the patterning layer are covered by the mask and not exposed to the EUV light. In step 340, the method 300 selectively etches the exposed portions of the patterning layer by exposing the substrate to a second plasma. In step 350, the method 300 repeats the selectively depositing and the selectively etching until the exposed portions of the patterning layer are completely removed.

Figure 4:
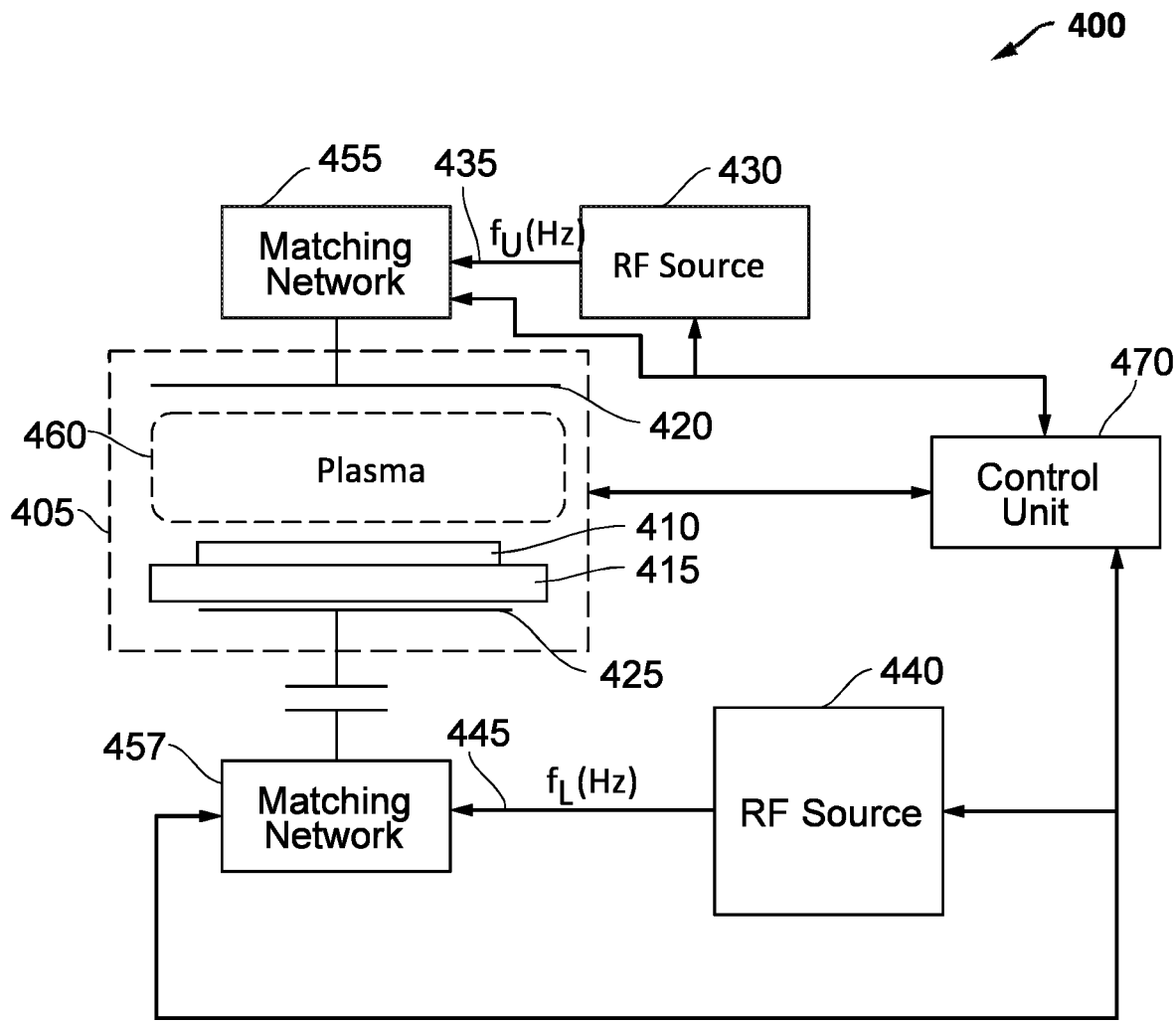
FIG. 4 is a block diagram illustrating one embodiment of a plasma processing system that may be used to pattern a substrate using the techniques described herein.

FIG. 4 provides one example embodiment for a plasma processing system 400 that can be used with respect to the disclosed techniques and is provided only for illustrative purposes. Although the plasma processing system 400 shown in FIG. 4 is a capacitively coupled plasma (CCP) processing apparatus, one skilled in the art would recognize the techniques described herein could be performed in inductively coupled plasma (ICP) processing apparatus, microwave plasma processing apparatus, Radial Line Slot Antenna (RLSA™) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems.

The plasma processing system 400 can be used for a wide variety of operations including, but not limited to, etching, deposition, cleaning, plasma polymerization, plasma enhanced chemical vapor deposition (PECVD), atomic layer deposition (ALD), atomic layer etch (ALE), and so forth. The structure of a plasma processing system 400 is well known, and the particular structure provided herein is merely of illustrative purposes. It will be recognized that different and/or additional plasma process systems may be implemented while still taking advantage of the techniques described herein.

Looking in more detail to FIG. 4, the plasma processing system 400 may include a process chamber 405. As is known in the art, process chamber 405 may be a pressure controlled chamber. A substrate 410 (in one example a semiconductor wafer) may be held on a stage or chuck 415. An upper electrode 420 and a lower electrode 425 may be provided as shown. The upper electrode 420 may be electrically coupled to a first radio frequency (RF) source 430 through a first matching network 455. The first RF source 430 may provide a source voltage 435 at an upper frequency ($f_U$). The lower electrode 425 may be electrically coupled to a second RF source 440 through a second matching network 457. The second RF source 440 may provide a bias voltage 445 at a lower frequency ($f_L$). Though not shown, it will be known by those skilled in the art that a voltage may also be applied to the chuck 415.

Components of the plasma processing system 400 can be connected to, and controlled by, a control unit 470 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that control unit 470 may be coupled to various components of the plasma processing system 400 to receive inputs from and provide outputs to the components.

The control unit 470 can be implemented in a wide variety of manners. For example, the control unit 470 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a prescribed plasma process recipe. It is further noted that the software or other programming instructions can be stored in one or more non-transitory computer-readable mediums (e.g., memory storage devices, FLASH memory, dynamic random access (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing system 400 uses the upper and lower electrodes to generate a plasma 460 in the process chamber 405 when applying power to the system from the first RF source 430 and the second RF source 440. The application of power results in a high-frequency electric field being generated between the upper electrode 420 and the lower electrode 425. Processing gas(es) delivered to process chamber 405 can then be dissociated and converted into a plasma 460. The generated plasma 460 can be used for processing a target substrate (such as substrate 410 or any material to be processed) in various types of treatments such as, but not limited to, plasma deposition, etching and/or ion bombardment/sputtering.

In some embodiments, the selective deposition and etch steps disclosed herein may be performed simultaneously using the same plasma 460. For example, a hydrocarbon (such as $CH_4$) based plasma 460 may be utilized to selectively deposit a protective layer on the unexposed portions 116 and selectively etch the exposed portions 114 of the patterning layer 108. In other embodiments, the selective deposition and etch steps disclosed herein may use different plasmas 460, which are segregated within the process chamber 405 for example by one or more purge steps.

As shown in FIG. 4, the exemplary plasma processing system 400 described herein utilizes two RF sources. In an exemplary embodiment, the first RF source 430 provides source power at relatively high frequencies to convert the processing gas(es) delivered into the process chamber 405 into plasma and to control the plasma density, while the second RF source 440 provides a bias power at lower frequencies to control ion bombardment energy.

In one example plasma processing system, the first RF source 430 may provide about 0 to 1400 W of source power in a high-frequency (HF) range from about 3 MHz to 150 MHz (or above) to the upper electrode 420, and the second RF source 440 may provide about 0 to 1400 W of bias power in a low-frequency (LF) range from about 0.2 MHz to 60 MHz to the lower electrode 425. Different operational ranges can also be used depending on type of plasma processing system and the type of treatments (e.g., etching, deposition, sputtering, etc.) performed therein.

In one exemplary embodiment, the first plasma 118 used in the deposition step shown in FIG. 1D may be performed with process conditions of 50 W to 1000 W source power, 0 W to 200 W bias power, 10 mT to 200 mT pressure, 0° C. to 150° C. electrostatic chuck temperature, and 50 standard cubic centimeters (SCCM) of $CH_4$ gas flow. Other gases, such as for example, $CH_3F$, $CH_2F_2$, etc. may also be used in the gas flow.

In one exemplary embodiment, the second plasma 122 used in the etch step shown in FIG. 1E may be performed with process conditions of 50 W to 1000 W source power, 0 W to 200 W bias power, 10 mT to 200 mT pressure, 10° C. to 150° C. electrostatic chuck temperature, and 20 to 100 standard cubic centimeters (SCCM) of $CH_4$ gas flow. Other gases, such as for example, $Cl_2$. $BCl_3$, inert gases, etc. may also be used in the gas flow. In some embodiments, the bias power may be adjusted or controlled to control the ion bombardment energy during the etch step. In some embodiments a separate surface activation/ion bombardment step may be performed with process conditions of 100 W to 500 W source power, 0 W to 200 W bias power, 10 mT to 200 mT pressure, 10° C. to 200° C. electrostatic chuck temperature, and 800 standard cubic centimeters (SCCM) of Ar gas flow. Other gases, such as for example, He, Ne, Kr, etc. may also be used in the gas flow.

It is noted that the techniques described herein may be utilized within a wide range of plasma processing systems. Although a particular plasma processing system 400 is shown in FIG. 4, it will be recognized that the techniques described herein may be utilized within other plasma processing systems. In one example system, the RF sources shown in FIG. 4 may be switched (e.g., higher frequencies may be supplied to the lower electrode 425 and lower frequencies may be supplied to the upper electrode 420). Further, a dual source system is shown in FIG. 4 merely as an example system. It will be recognized that the techniques described herein may be utilized with other plasma processing systems in which a modulated RF power source is provided to one or more electrodes, direct current (DC) bias sources are utilized, or other system components are utilized.

It is noted that various deposition processes can be used to form one or more of the material layers shown and described herein. For example, one or more depositions can be implemented using chemical vapor deposition (CVD), plasma enhanced CVD (PECVD), physical vapor deposition (PVD), atomic layer deposition (ALD), and/or other deposition processes. In one example plasma deposition process, a precursor gas mixture can be used including but not limited to hydrocarbons and fluorocarbons, possibly in combination with one or more dilution gases (e.g., argon, nitrogen, etc.) at a variety of pressure, power, flow and temperature conditions.

It is further noted that various etch processes can be used to etch one or more of the material layers shown and described herein. For example, one or more etch processes can be implemented using plasma etch processes, discharge etch processes, and/or other desired etch processes. The plasma etch processes described herein can be implemented using plasma containing hydrogen, halocarbons and other halogen containing chemistries, argon and/or other gases. As noted above, one or more operational parameters (e.g., bias power) of the plasma etch processes described herein may be tuned to control the ion bombardment energy during the etch step.

Other operating variables for process steps can also be adjusted to control the various deposition and/or etch processes described herein. The operating variables may include, for example, the chamber temperature, chamber pressure, flowrates of gases, types of gases, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for patterning a substrate, the method comprising:
   forming a patterning layer and one or more underlying layers on the substrate, wherein the patterning layer comprises a metal-oxide photoresist;
   performing an extreme ultraviolet (EUV) or lower wavelength lithography step, in which portions of the patterning layer not covered by an overlying mask are exposed to EUV or lower wavelength light; and
   performing a cyclic, dry process to remove a portion of the patterning layer defined by the lithography step and develop a metal-oxide photoresist pattern.

2. The method of claim 1, wherein the cyclic, dry process comprises:
   selectively depositing a protective layer onto unexposed portions of the patterning layer by exposing the substrate to a first plasma, wherein the unexposed portions of the patterning layer are covered by the overlying mask and not exposed to the EUV or lower wavelength light;
   selectively etching exposed portions of the patterning layer by exposing the substrate to a second plasma, wherein the exposed portions of the patterning layer are not covered by the overlying mask and are exposed to the EUV or lower wavelength light; and
   repeating the selectively depositing and the selectively etching until the exposed portions of the patterning layer are completely removed.

3. The method of claim 2, wherein the first plasma comprises a hydrocarbon or fluorocarbon based precursor gas.

4. The method of claim 2, wherein the second plasma comprises a hydrogen or halogen containing precursor gas and an inert gas.

5. The method of claim 4, wherein each time the selectively etching step is performed, the hydrogen or halogen containing precursor gas converts a surface of the exposed portions of the patterning layer into a volatile material, and ions of the inert gas bombard a surface of the substrate to remove the volatile material from the exposed portions.

6. The method of claim 5, wherein each time the selectively depositing step is performed, a new protective layer is deposited onto the unexposed portions of the patterning layer.

7. A method for patterning a substrate, the method comprising:
   forming a patterning layer and one or more underlying layers on the substrate, wherein the patterning layer comprises a metal-oxide photoresist;
   exposing portions of the patterning layer, which are not covered by a mask overlying the patterning layer, to extreme ultraviolet (EUV) or lower wavelength light;
   selectively depositing a protective layer onto unexposed portions of the patterning layer by exposing the substrate to a first plasma, wherein the unexposed portions of the patterning layer are covered by the mask and not exposed to the EUV or lower wavelength light; and
   selectively etching exposed portions of the patterning layer by exposing the substrate to a second plasma.

8. The method of claim 7, wherein the patterning layer comprises a metal-oxide material, which includes clusters of metal-oxide structures having chemically bound organic ligands, and wherein exposing the portions of the patterning layer not covered by the mask to EUV or lower wavelength light separates the organic ligands from the metal-oxide structures, while leaving the unexposed portions of the patterning layer unchanged.

9. The method of claim 8, wherein after exposing the portions of the patterning layer not covered by the patterned mask layer to EUV or lower wavelength light and before selectively depositing the protective layer onto the unexposed portions of the patterning layer, the method further comprises performing a bake process to release the organic ligands from the exposed portions of the patterning layer.

10. The method of claim 7, wherein the first plasma comprises a hydrocarbon or fluorocarbon based precursor gas.

11. The method of claim 10, wherein the first plasma comprises $CH_4$, $C_4F_8$, $C_4F_6$ or $CH_3F$.

12. The method of claim 7, wherein the second plasma comprises a hydrogen or halogen containing precursor gas.

13. The method of claim 12, wherein the second plasma comprises $CH_4$, $CF_4$, $CHF_3$ or $BCl_3$.

14. The method of claim 12, wherein the second plasma further comprises an inert gas.

15. The method of claim 8, wherein the second plasma further comprises argon (Ar).

16. The method of claim 12, wherein the hydrogen or halogen containing precursor gas converts a surface of the exposed portions of the patterning layer into a volatile material, and wherein inert gas ions bombard the surface of the exposed portions to remove the volatile material.

17. The method of claim 7, wherein the selectively depositing a protective layer onto unexposed portions of the patterning layer and the selectively etching exposed portions of the patterning layer are performed simultaneously within a plasma processing chamber using the same plasma precursor gases to generate the first plasma and the second plasma.

18. The method of claim 17, wherein the first plasma and the second plasma each comprise a hydrocarbon precursor and an inert gas.

19. The method of claim 7, wherein the selectively depositing a protective layer onto unexposed portions of the patterning layer and the selectively etching exposed portions of the patterning layer are segregated within a plasma processing chamber, so that different plasma precursor gases are used to generate the first plasma and the second plasma.

20. The method of claim 19, wherein the first plasma comprises a hydrocarbon precursor, and wherein the second plasma comprises a halocarbon precursor and an inert gas.

* * * * *